United States Patent [19]

McKenzie, Jr.

[11] 4,373,655
[45] Feb. 15, 1983

[54] COMPONENT MASK FOR PRINTED CIRCUIT BOARDS AND METHOD OF USE THEREOF

[76] Inventor: Joseph A. McKenzie, Jr., 6330 Laura La., Pleasanton, Calif. 94566

[21] Appl. No.: 163,303

[22] Filed: Jun. 26, 1980

[51] Int. Cl.³ ............................ H05K 3/34; B23K 31/02
[52] U.S. Cl. .................................. 228/180 R; 29/832;
29/837; 174/68.5; 228/39; 228/215
[58] Field of Search .................... 228/39, 180 R, 214,
228/215; 339/38, 275 B; 29/832, 837, 838, 839;
361/400, 405; 174/68.5

[56] References Cited

U.S. PATENT DOCUMENTS

| | | | |
|---|---|---|---|
| 3,059,152 | 10/1962 | Khouri | 174/68.5 X |
| 3,246,386 | 4/1966 | Ende | 228/180 X |
| 3,524,960 | 8/1970 | Lohff | 29/832 X |
| 3,525,143 | 8/1970 | De Vito | 228/39 |
| 3,604,836 | 9/1971 | Pierpont | 361/405 X |
| 4,246,627 | 1/1981 | Poensgen | 361/405 |

FOREIGN PATENT DOCUMENTS 602704 8/1960 Canada ......................... 29/839

OTHER PUBLICATIONS

Skip-A-Dip, Micro Electronic Systems, Inc.
Mass Soldering Loading Fixture Having Masking Pins, Western Electric, Technical Digest No. 21, Boyer et al, Jan. 1971.

Primary Examiner—Joseph H. McGlynn
Assistant Examiner—Fred A. Silverberg
Attorney, Agent, or Firm—C. Michael Zimmerman; Ralph L. Mossino

[57] ABSTRACT

Component masks are described for preserving unoccupied holes in a printed circuit board when such board is subjected to wave soldering. Each mask is a body of plastic resistant to adherence to the solder and capable of withstanding the temperature of solder when the printed circuit board is subjected to wave soldering and includes a supporting block from which a plurality of parallel pins protrude for reception into the printed circuit board lead-holes to be preserved. The pins are spaced from one another by distances equal to the distances between lead-holes on a printed circuit board, and component masks are provided respectively having a single row and a double row of such pins. Each pin is tapered slightly toward its free end, and is connected to its associated supporting block by a conically shaped transition body. Each transition body is dimensioned to rest on the printed circuit board about the lead-hole in which the associated pin is inserted to space the supporting block away from the printed circuit board. The pins are dimensioned and configured to enable the lead-holes to be preserved during mass soldering of the printed circuit board, while at the same time allowing their interior walls to be wetted with solder.

10 Claims, 6 Drawing Figures

COMPONENT MASK FOR PRINTED CIRCUIT BOARDS AND METHOD OF USE THEREOF

BACKGROUND OF THE INVENTION

The present invention relates to a tool for assembling printed circuit boards having utility as a component mask for preserving unoccupied lead-holes in the printed circuit board during mass connection of components thereto, and its method of use.

Electronic circuitry often includes one or more printed circuit boards providing the physical and electrical substrates connecting various electronic components together. A printed circuit board generally is a sheet of a rigid non-conductive material having electrically conductive lead patterns printed or otherwise provided on one or both of its sides. The lead patterns connect various terminal lead-holes extending through the underlying board, and the desired circuit is formed by installing electrical and electronic components, such as integrated circuit chips, transisters, etc., on the board with their terminals protruding into and through the lead-holes. The terminals of the components are then attached to the printed circuit board by soldering or the like to provide both physical connection of the components to the board and electrical connection of their terminals to the conductive lead patterns.

The above procedure is only practical if most of the component terminals are secured to the printed circuit board simultaneously by a mass connecting technique, such as wave soldering. That is, it would be quite impractical to independently secure each of the separate component terminals to the board, in view of the large number of them and their small size. Thus, electronic circuits are generally formed on printed circuit boards by mounting the electronic components on a single side of the printed circuit board, with the terminals extending to the opposite side. Such opposite side then is subjected to a mass connecting technique to simultaneously secure the terminals of all such components to the board. Wave soldering, i.e., the subjection of the underneath side of such a printed circuit board to a traveling wave of solder, is quite widely used as a mass connection technique.

The difficulty with use of wave soldering is that it is incapable of discriminating between those lead-holes extending through a printed circuit board which in fact have component terminals extending therethrough, and those lead-holes which do not. And it is not unusual for it to be desirable to keep unobstructed of solder at least some of those lead-holes which are unoccupied by component terminals at the time of wave soldering. For example, for some circuitry it is desirable to be able to secure some electronic components to a board after most are already secured thereto by wave soldering. Moreover, it is not unusual for component parts to be unavailable due to supply shortages and the like, at the time it is desired that a board be subjected to wave soldering.

Various techniques and procedures have been used in the past to prevent solder from entering lead-holes which are unoccupied at the time the printed circuit board is subjected to wave soldering. For example, tape or latex has been applied over the ends of holes to be spared on the underneath side of the printed circuit board, to mask such holes from solder. Since it is difficult to apply such tape or latex to the underneath side of a board after electrical components have been placed into position on the upper side of such board, use of such masking techniques has been limited to use prior to component assembly. Thus, such techniques are unavailable for uses at the last moment, i.e., when some parts on order are not delivered on time. Moreover, use of a tape often leaves an undesired adhesive residue on the underneath side of the board. And if latex or the like is used, "plugs" of the material often remain in the lead-holes after the same is otherwise removed.

Another approach used in the past, has been to insert simple wooden toothpicks in the lead-holes to be preserved. This approach leaves much to be desired. The cross-sectional dimensions of toothpicks are not uniform, with the result that it is not unusual to find lead-holes which are partly plugged with solder because a toothpick which was meant to preserve the same did not extend completely through the hole. Toothpicks which are only loosely engaged within a hole have the disadvantage of either leaving too restricted of an unobstructed lead-hole, or falling out before or during wave soldering. The high temperature associated with wave soldering also chars toothpicks, leaving charred residue within the lead-holes. In another approach used in the past, a plurality of uniformly tapered metal pins embedded in a supporting block has been used to mask lead-holes during mass soldering of printed circuit boards. The pins are tapered so that they wedge against the edge of the lead-holes to hold the supporting block spaced away from the printed circuit board. The metal pins are constructed of a material that is thermally conductive while at the same time not being susceptible to wetting by most common fluxes found in solder used in mass soldering processes. These combined characteristics of the pin material prevents solder from entering the lead-holes. However, such non-solderable metal pins are susceptible to wetting by highly active fluxes. When wetted, solder is permitted to enter the lead-holes and adhere to the pins. This often results in the formation of solder obstructions in the lead-holes or prevention of the easy removal of the pins from the lead-holes after the completion of the wave soldering process. To avoid such adverse consequences, a coating of Teflon fluorocarbon polymer has been applied to the pins to prevent wetting by highly active fluxes. While the Teflon coating prevents such wetting, the pins remain thermally conductive to prevent any solder from entering the lead-holes.

SUMMARY OF THE INVENTION

The present invention provides a component mask for preserving unoccupied lead-holes in a printed circuit board when it is subjected to a mass connection material while permitting wetting of the walls defining the lead-holes, which is simple, reliable, installable at any time prior to such mass connection, and does not leave unwanted residue either on the underneath side of the board or within the lead-holes. In broad terms, the component mask of the invention comprises a supporting block from which at least one pin protrudes. The pin is constructed of a plastic material that is stable in the presence of the high temperatures commonly encountered in mass soldering processes. The pin has a cross-sectional configuration and thickness enabling the same to fit into a lead-hole extending through a printed circuit board, and a length at least generally equal to the thickness of the printed circuit board so that it will extend completely through such hole. Most desirably there are a plurality of such pins protruding from such block, which pins are generally parallel to one another and are spaced apart by distances generally equal to the distances between lead-holes on a printed circuit board. Thus, a single component mask of the invention is capable of simultaneously masking a plurality of adjacent board lead-holes.

As one feature of the component mask of the invention, each of the pins is secured to the mask supporting block by a transition body that acts to space the supporting block from the printed circuit board when the pin is received within a lead-hole. This facilitates cleaning of the board after a wave soldering operation. That is, the block is raised from the board to insure it does not entrap flux residue or mask portions of the surface of the board when it is subjected to water or solvent cleaning.

As another feature of the mask of the invention, each of the pins is tapered inwardly toward its free end. As will be explained in more detail below, such a pin configuration enables lead-holes to be preserved during wave soldering, while at the same time allowing their interior walls to be wetted with solder to facilitate subsequent physical and electrical securance of a component terminal therewithin.

The invention also includes the method by which the component mask is used. That is, it includes the steps of providing a component mask meeting the claimed criteria, and mounting the same on a board with the supporting block on one of the sides thereof with its pins extending completely through the lead-holes to be preserved. Following mounting of the supporting block, the printed circuit board is subjected to a mass connection material. It further includes more specifically, removing the component mask from the printed circuit board after such board has been subjected to the mass connection material.

The invention includes other features and advantages which will be discussed or will become apparent from the following, more detailed description.

BRIEF DESCRIPTION OF THE DRAWING

With reference to the accompanying two sheets of drawing.

DETAILED DESCRIPTION OF PREFERRED EMBODIMENTS

Figure 1:
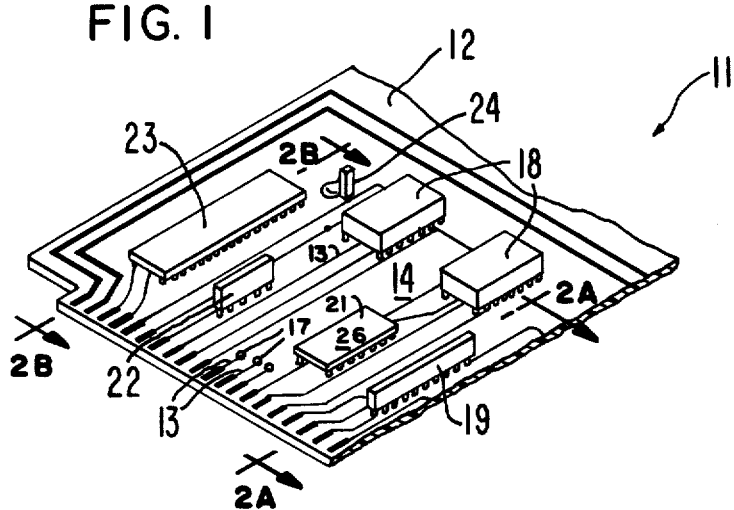
FIG. 1 is a perspective view of a portion of a printed circuit board having various embodiments of the component mask of the invention installed therein.
Figure 2A:
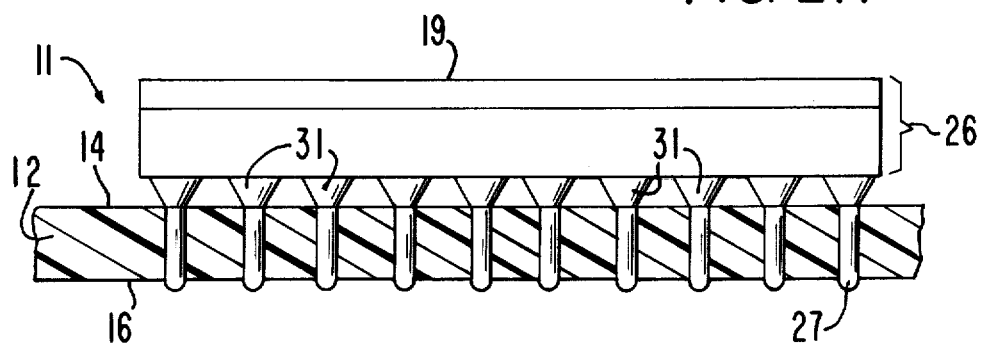
FIGS. 2A and 2B are sectional views of the board and component mask of FIG. 1, taken respectively on planes indicated by the lines 2A—2A and 2B—2B in FIG. 1.
Figure 2B:
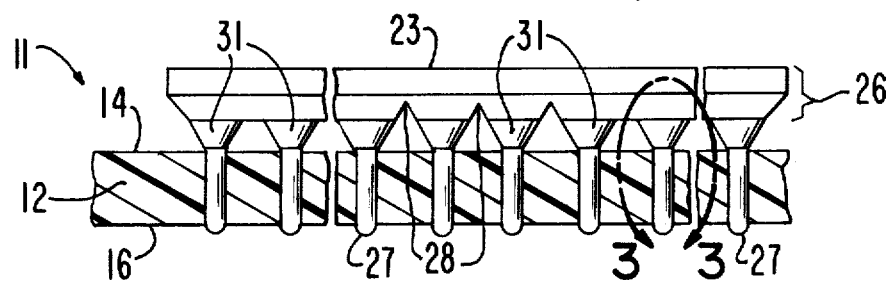
Figure 3:
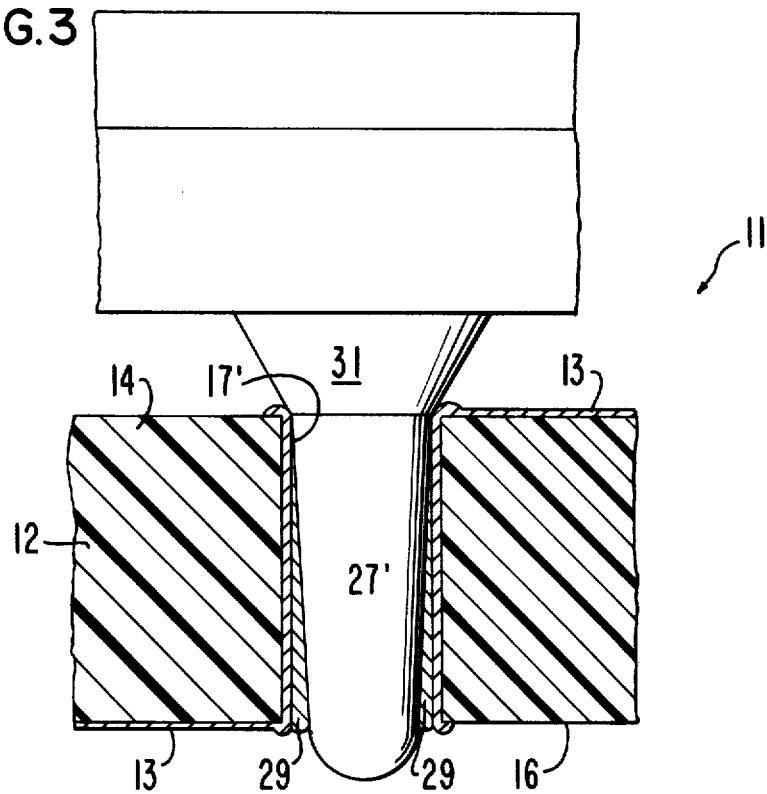
FIG. 3 is a substantially enlarged view of that portion of FIG. 2B, encircled by the line 3—3.

With reference first to FIGS. 1, 2 and 3, a portion of a printed circuit board, generally referred to by the reference numeral 11, is illustrated having a plurality of component masks of the invention installed thereon. Board 11 includes a rigid sheet 12 of electrically nonconductive material (for example, a resin impregnated fiberglass) having patterns of electrically conductive leads 13 on its upper and lower side surfaces 14 and 16. As illustrated, a plurality of lead-holes 17 are provided extending through such board, providing receptacles for the terminals of electronic components (two of which are schematically represented and denoted by the reference numeral 18), making up a desired electrical circuit. As previously mentioned, the printed circuit board acts both to physically support such components and to provide the lead connections between various component terminals necessary to complete an electrical circuit.

The electronic circuit for which a specific printed circuit board is intended, typically is produced by mounting the requisite electronic components at the appropriate locations on the board with their terminals extending through the lead-holes provided for this purpose. The lower (underneath) surface 16 of such a printed circuit board is then subjected to a mass connection technique, such as to solder by a wave soldering process, to simultaneously secure all of the component terminals which extend through lead-holes, both physically and electrically to such lead holes. The result is that the components are structurally secured to the board. Moreover, the terminals are placed in good electrical contact with the printed circuit board patterns.

As mentioned earlier, wave soldering subjects the full lower surface of a board to solder, with the result that solder will enter into and block those lead-holes which are not at the time occupied by component terminals. It is often desirable that unoccupied lead-holes be protected during wave soldering to preserve the same for subsequent installation of components. As mentioned previously, the art generally has relied upon the masking at such holes with tape or a material such as latex prior to board assembly for this purpose, or the utilization of toothpicks or the like to plug such holes. The difficulties and disadvantages associated with such procedures is discussed infra.

The present invention provides a tool for assembling printed circuit boards having utility as a component mask for preserving unoccupied lead-holes during soldering, having significant advantages over prior mechanisms and approaches to attempting to preserve such unoccupied lead-holes. Embodiments of such component mask are illustrated installed on board 11, at 19–24. Each of such components includes a supporting block 26 from which one or more pins 27 protrude. As illustrated, the pins 27 protruding from each supporting block are generally parallel to one another. Moreover, as shown, each of the pins 27 has a length at least generally equal to the thickness of the printed circuit board so that it will extend completely through the lead-hole. This is necessary to assure that solder will not plug the lower portion of such lead-holes.

Figure 4A:
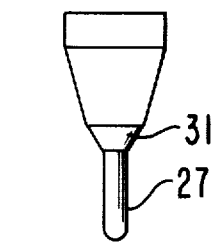
FIGS. 4A and 4B are end views of two preferred embodiments of the component mask of the invention.
Figure 4B:
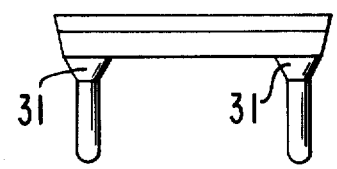

Certain of the component masks, i.e., masks 19, and 22, include a single row of pins, whereas others are furnished with two generally parallel rows of such pins. Such masks respectively are designed to occupy the terminal holes provided for components having similarly single or double rows of terminals. FIGS. 4A and 4B are each end views, respectively, of a single row and double row mask. The pins of each are spaced apart from one another by distances generally equal to distances commonly provided between lead-holes on printed circuit boards. That is, the pins in each row are placed on 0.100" centers, and adjacent rows are spaced 0.300" from one another.

As can be seen, differing lengths of component masks providing correspondingly differing numbers of pins, are provided. As a feature of the instant invention, it is designed to enable such differing lengths to be provided, without a corresponding requirement on the length variations that must be provided by a manufacturer of the mask. That is, such masks are made of a material which can be easily cut or broken, and the manufacturer then need only provide relatively long embodiments of the single and double row masks. One manufacturer is providing a single row pin embodiment having 24 pins. The masks 19, 22 and 24 illustrated in FIG. 1, are formed from such an embodiment. The same manufacturer is providing a double row embodiment having two rows of 16 pins. Such embodiment illustrated in FIG. 2B is especially designed to facilitate cutting or breaking at locations which will furnish masks corresponding to commonly used electronic components. That is, with reference to FIG. 2B, it will be seen that indents 28 are provided between the center pair and each adjacent pair, of pins, across the full width of the supporting block to provide it with reduced thicknesses between the adjacent pins. This facilitates breaking or cutting of a double row embodiment having 16 pins in each row, into mask pieces having two rows of 7, 8, or 9 pins. A suitable material for component masks of the invention is glass filled nylon, with the percentage of glass fiber being 20% to 40%. The component mask can be molded, and can include suitable coloring pigmentation. If the coloring material which is included is a low-friction material, such as carbon-black, it is desirable that a significant portion of the coloring material be included to aid in lowering the coefficient of friction of the pins and thereby facilitate their insertion into board lead-holes.

Reference is made to FIG. 3 for a more detailed showing and description of the manner in which a mask of the invention preserves unoccupied lead-holes. With reference to such figure, a significantly enlarged portion of a printed circuit board sheet 12 having leads 13 on each of its sides projecting into a terminal hole 17' is illustrated. A pin 27' of a component mask of the invention is shown extending through the lead-hole to thereby block the same. In this connection, the pin has a cross-sectional configuration and thickness enabling the same to fit into such lead-hole. Typically, lead-holes are circular in cross-section and most desirably the pin has a corresponding circular cross-section. Most printed circuit board holes have a diameter of at least about 0.03", and the pins of the component masks are provided with a diameter slightly less to facilitate easy insertion into the board holes.

As a particularly salient feature of the instant invention, the pins taper slightly inwardly toward their free end. This slight tapering is illustrated in FIG. 3. Such tapering not only facilitates insertion of the pins into the holes by reducing the dimensions of the free ends, but also results in the walls of the lead-holes themselves being wetted by solder during the wave soldering operation, when the component mask is mounted on the printed circuit board with the supporting block on the same side of the board as the electronic components 18 (FIG. 1). That is, because each of the pins has a relatively loose fit at the underneath surface of the board by reason of such taper, solder applied to such surface by wave soldering is capable of entering into its associated lead-hole and coating its interior wall surface. Such a solder coating is represented in FIG. 3 at 29. Wetting of the lead-holes enhances the likelihood of good electrical contact with, and physical securance to, component terminals subsequently inserted into such holes. As an example of suitable tapering, pins that are approximately 0.1" long can be tapered approximately 0.003" from their base to their tip.

The pins of each component mask should have a cross-sectional area at their base which is generally the same as the cross-sectional areas of the lead-holes for which they are designed. A maximum base cross-sectional area of between about 0.030" and 0.033" is generally suitable. And it is contemplated that different embodiments of the masks of the invention be provided, having different pin cross-sectional areas at the extremes of such range. This will enable differing sized lead-holes to be easily accommodated. One manufacturer of the masks of the invention is providing single pin embodiments with the pins tapering from 0.030" at their bases to 0.027" at their tips, and double pin embodiments at which the pins taper from 0.033" to 0.030".

As another salient feature of the mask of the invention, transition bodies are provided for the pins to space the supporting block from the printed circuit board when such pins are received within lead-holes. Such transition bodies are denoted in the figures by the reference numeral 31 and, as illustrated, are generally conical in shape. That is, each is an inverted conic section having generally the same cross-sectional dimensions at its lower end as the pin with which it is associated. And it tapers conically outward from its connection to its associated pin, to the supporting block.

The primary purpose of the transition bodies 31 is to space the supporting block of each mask away from the surface of the board on which such mask is mounted. This ensures that such supporting block will not entrap flux residue, and enables the board surface to be unobstructedly flushed with a cleaning fluid. The conical shape of the transition bodies is advantageous in this respect, in the sense that because of their large cross-section relative to the pins, they are assured of spacing the block away from the board. However, because they have generally the same cross-sectional dimensions as such pins at their point of connection thereto, they themselves do not obstruct the board surface. The inverted conical shape of the transition bodies assures that the upper end of each of the lead-holes receiving a pin is closed to prevent solder or the like from leaking through to the upper surface of the board.

Embodiments of the component mask in which the pins snugly fit in board lead-holes, the masks once mounted on a board are generally self-supporting, i.e., do not require external support to remain mounted. However, as illustrated, a small amount of a material such as latex can be used to adhere the single pin mask 24 to the board, for assurance that such mask will not inadvertently become separated from such board.

It will be readily appreciated from the above, how component masks of the invention are to be used. Such masks simply are mounted prior to wave soldering on one of the sides of the printed circuit board, for example, the side opposite that to be subjected to wave soldering, with the pins extending completely through the lead-holes to be preserved. One advantage of the instant invention is that such mounting can take place at any time prior to the wave soldering. That is, electronic components can be assembled on a board up to those components which may be missing. In the event the missing components are not available at the time wave soldering is to take place, component masks of the invention simply can be substituted therefor.

The component mask provided on a printed circuit board can be removed simply after wave soldering by extraction with pliers or the like. In this connection, as illustrated, the end and side walls of the supporting blocks of the components taper inwardly somewhat to facilitate gripping. It should be noted that one feature of the mask of the invention is that it need not be removed. That is, if it is not desired to utilize the lead-holes being preserved by a mask, the mask simply can be left in place to be a "dummy" component.

While the invention has been described in connection with preferred embodiments thereof, it will be appreciated by those skilled in the art that various changes and modifications can be made without departing from its spirit. It is therefore intended that the coverage afforded applicant be limited only by the claims and their equivalent language.

I claim:

1. A component mask for preserving unoccupied lead-holes in a printed circuit board during the application of high temperature mass connection material to mass connect electronic components to said printed circuit board while permitting high temperature mass connection material to enter said lead-holes to wet their walls and form a coating of high temperature mass connection material thereon, comprising:
   (A) a supporting block; and
   (B) at least one pin of plastic protruding from said block, said plastic resistant to adherence to the high temperature mass connection material and capable of withstanding the temperature of the high temperature mass connection material during mass connection of electronic components to the printed circuit board, and said pin having:
      (1) a cross-sectional configuration and thickness enabling the pin to fit into a lead-hole extending through a printed circuit board and occupy said lead-hole except for a clearance surrounding the pin between the pin and wall defining the lead-hole that permits high temperature mass connection material to enter said lead-hole and wet said walls; and
      (2) a length at least generally equal to the thickness of said printed circuit board whereby said pin can extend completely through said lead-hole.

2. A component mask according to claim 1 wherein said at least one pin comprises a plurality of pins protruding from said block generally parallel to one another, said pins are spaced apart from one another by distances generally equal to the distances between lead-holes on a printed circuit board.

3. A component mask according to claim 2 wherein there are two generally parallel rows of said pins projecting from said supporting block.

4. A component mask according to either claim 1 or claim 2 further including a transition body of plastic for each pin respectively connecting said each pin to said supporting block, said plastic of said transition body resistant to adherence to the high temperature mass connection material and capable of withstanding the temperature of the high temperature mass connection material during mass connection of electronic components to the printed circuit board; said transition body has adjacent the pin with which it is associated, generally the same cross-sectional dimensions as said pin, and spaces said supporting block from said printed circuit board when said pin is received within a lead-hole extending through said board.

5. A component mask according to claim 4 wherein each pin is generally circular in cross-section and said transition body tapers conically outward from its connection to its associated pin to said supporting block.

6. A component mask according to claim 1 or claim 2 wherein each pin is generally circular in cross-section and tapers inward along its length from its end at the block to its free end to define the clearance between said pin and wall.

7. A component mask according to claim 6 further including a transition body of plastic for each pin respectively connecting said each pin to said supporting block, said plastic of the transition body resistant to adherence to the high temperature mass connection material and capable of withstanding the temperature of the high temperature mass connection material during mass connection of electronic components to the printed circuit board, said transition body has adjacent the pin with which it is associated generally the same cross-sectional dimensions as said pin, and spaces said supporting block from said printed circuit board when said pin is received within a lead-hole extending through said board, said transition body tapering outward from its connection to its associated pin to said supporting block.

8. A method of preserving unoccupied lead-holes in a printed circuit board and wetting walls defining said lead-holes to coat the walls with a mass connection material during mass connection of electronic components to the printed circuit board by subjecting said board to a high temperature mass connection material, comprising:
   (A) providing a component mask which comprises a supporting block having at least one pin of plastic protruding therefrom, said plastic resistant to adherence to the high temperature mass connection material and capable of withstanding the temperature of the high temperature mass connection material during the subjecting of said printed circuit board to the high temperature mass connection material, said pin having:
      (1) a cross-sectional configuration and thickness enabling the pin to fit into a lead-hole extending through a printed circuit board and occupy said lead-hole except for a clearance surrounding the pin between the pin and the wall defining the lead-hole that permits high temperature mass connection material to enter said lead-hole and wet said wall; and
      (2) a length at least generally equal to the thickness of said printed circuit board whereby said pin can extend completely through said lead-hole; and
   (B) mounting said component mask on said printed circuit board with said supporting block on a side thereof, with said pin extending completely through a lead-hole of said board to be preserved.

9. A method according to claim 8 further including the step after said board is subjected to said mass connection material, of:
   removing said component mask from said printed circuit board to leave said printed circuit board with said lead-hole wetted and unblocked by said mass connection material.

10. A tool for assembling a printed circuit board by mass connection of electronic components in lead-holes formed in the printed circuit board, said mass connection accomplished by subjecting the printed circuit board to a high temperature mass connection material, comprising:

(A) a supporting block;
(B) at least one pin protruding from said block having:
  (1) a cross-sectional configuration and thickness enabling the pin to fit into a lead-hole extending through a printed circuit board and occupy said lead-hole except for a clearance surrounding the pin between the pin and wall defining the lead-hole, wherein the cross-sectional configuration and thickness of the pin is selected so that when the pin is positioned in the lead-hole the clearance between the pin and lead-hole permits high temperature mass connection material to enter the lead-hole and wet its wall to form a coating of high temperature mass connection material thereon during the subjecting of the printed circuit board to the high temperature mass connection material; and
  (2) a length at least generally equal to the thickness of said printed circuit board whereby said pin can extend completely through said lead-hole;
(C) a transition body for each pin connecting the pin to the supporting block and located to abut the lead-hole; and
(D) the pin and the transition body are of nylon resistant to adherence to the high temperature mass connection material and capable of withstanding the temperature of the high temperature mass connection material during the subjecting of the printed circuit board to the high temperature mass connection material.

* * * * *